United States Patent
Toda

[19]

[11] Patent Number: 6,118,206

[45] Date of Patent: Sep. 12, 2000

[54] PIEZOELECTRIC SIGNAL CONVERTER

[76] Inventor: Kohji Toda, 1-49-18 Futaba, Yokosuka 239-0814, Japan

[21] Appl. No.: 09/216,128

[22] Filed: Dec. 16, 1998

[51] Int. Cl.$^7$ .................................................. H01L 41/107
[52] U.S. Cl. ........................................... 310/318; 310/319
[58] Field of Search .................................... 310/318, 319, 310/316.01, 366; 363/15, 95

[56] References Cited

U.S. PATENT DOCUMENTS

| | | | |
|---|---|---|---|
| 2,289,954 | 7/1942 | Arndt | 310/319 |
| 5,986,384 | 11/1999 | Toda | 310/319 |

*Primary Examiner*—Thomas M. Dougherty

[57] ABSTRACT

A piezoelectric signal converter comprises a piezoelectric ceramic, four electrodes $P_A$, $P_B$, $Q_C$ and $Q_D$, a load resistance R consisting of N parts $R_i$ (i=1, 2, ..., N), N–1 terminals $T_i$ {i=1, 2, ..., (N–1)} between two parts $R_i$ and $R_{(i+1)}$, and two terminals $T_0$ and $T_N$, formed on the electrodes $Q_C$ and $Q_D$, respectively. The electrodes $P_A$, $P_B$, $Q_C$ and $Q_D$ are formed on four side surfaces A, B, C and D, of the piezoelectric ceramic, respectively. The load resistance R is connected between the terminals $T_0$ and $T_N$. The piezoelectric ceramic, the electrodes $P_A$, $P_B$, $Q_C$ and $Q_D$, form a piezoelectric vibrator. When a high-frequency electric signal $E_{IN}$ with a voltage $V_{IN}$ is applied to the electrodes $P_A$ and $P_B$, the piezoelectric vibrator is vibrated at a frequency approximately equal to the resonance frequency of the piezoelectric ceramic. An acoustic vibration in the piezoelectric vibrator is transduced to an electric signal $E_{OUT}$ with a voltage $V_{OUT}$ and a frequency approximately equal to the resonance frequency. The voltage $V_{OUT}$ is equal to the sum of N voltages $V_i$ (i=1, 2, ..., N) corresponding to the parts $R_i$, respectively. Thus, at least a pair, composed of two of all the terminals $T_0$, $T_i$ and $T_N$, delivers an electric signal with a voltage between two terminals which make the pair.

17 Claims, 10 Drawing Sheets

PIEZOELECTRIC SIGNAL CONVERTER

BACKGROUND OF THE INVENTION

1. Field of the Invention

The present invention relates to a piezoelectric device for converting an input electric signal to an output electric signal through a piezoelectric vibrator.

2. Description of the Prior Art

Signal converters are applied, for example, to switching power supplies. Switching power supplies are used extensively as power supplies for telegraphic instruments, electric computers and so on. Conventional switching power supplies convert a power supply with direct current to an electric power with high frequency by using a high speed switching effect of a semiconductor, and then control and rectify the electric power to obtain a favorite direct current. In order to miniaturize switching power supplies, it is necessary to operate at higher switching frequencies and to size all sorts of parts down. However, an operation at higher switching frequencies brings damages on a semiconductor and an electromagnetic transformer, the damages increasing at 1 MHz and over. Therefore, it was difficult to more miniaturize switching power supplies. In order to minimize the damage on the semiconductor, it is necessary to improve a delay of a switching action generated in a switching circuit by means of the resonance and so on. In order to minimize the damage of the electromagnetic transformer, it is necessary to improve the materials of the electromagnetic transformer. However, remarkable improvements were difficult. Thus, various attempts to use a piezoelectric transformer in a switching power supply circuit were made. Conventional piezoelectric transformers include a polarization conversion type, a longitudinal vibration type and so on. The piezoelectric transformer of the polarization conversion type has a difficulty in a large amplitude action because of, for example, an acoustic damage of the materials, and an electric- or acoustic hysteresis phenomena of the materials. The piezoelectric transformer of the longitudinal vibration type has a difficulty in controlling the voltage ratio when a load resistance in a power supply circuit with the piezoelectric transformer is low. Moreover, the piezoelectric transformer of the longitudinal vibration type is easy to be broken by a large electric power. In addition, it is difficult to support a piezoelectric body, and it is necessary to reinforce the support in proportion to the increase of electric power, excessive reinforcement being easy to break the piezoelectric body.

SUMMARY OF THE INVENTION

An object of the present invention is to provide a piezoelectric signal converter capable of converting an input electric signal to an output electric signal through a piezoelectric vibrator effectively.

Another object of the present invention is to provide a piezoelectric signal converter with a small size which is very light in weight and has a simple structure.

A still other object of the present invention is to provide a piezoelectric signal converter applicable widely, for example, as a switching power supply and so on.

According to one aspect of the present invention there is provided a piezoelectric signal converter comprising a piezoelectric ceramic, electrodes $P_A$, $P_B$, $Q_C$ and $Q_D$, terminals $T_0$ and $T_N$, a load resistance R connected between the terminals $T_0$ and $T_N$, and N−1 terminals $T_i$ {i=1, 2, . . . , (N−1)}. The piezoelectric ceramic, the electrodes $P_A$, $P_B$, $Q_C$ and $Q_D$, form a piezoelectric vibrator. The piezoelectric ceramic has a pillar shape with two rectangular end surfaces and four side surfaces A, B, C and D, the end surfaces being parallel to each other, the side surfaces A and B being parallel to each other, the side surfaces C and D being parallel to each other. The electrodes $P_A$ and $P_B$ are formed on the side surfaces A and B, respectively. The electrodes $Q_C$ and $Q_D$ are formed on the side surfaces C and D, respectively. The terminals $T_0$ and $T_N$ are formed on the electrodes $Q_C$ and $Q_D$, respectively. The load resistance R consists of N parts $R_i$ (i=1, 2, . . . , N). The N−1 terminals $T_i$ are formed between two parts $R_i$ and $R_{(i+1)}$.

If a high-frequency electric signal $E_{IN}$ with a voltage $V_{IN}$ is applied between the electrodes $P_A$ and $P_B$, the piezoelectric vibrator is vibrated at a frequency approximately equal to the resonance frequency of the piezoelectric ceramic. An acoustic vibration, having a directionality mainly along the vertical direction to the side surface C, in the piezoelectric vibrator, is transduced to an electric signal $E_{OUT}$ between the electrodes $Q_C$ and $Q_D$, the electric signal $E_{OUT}$ having a voltage $V_{OUT}$ and a frequency approximately equal to the resonance frequency. In this time, it is possible to control the voltage $V_{OUT}$ to the voltage $V_{IN}$ by means of making an area of the electrode $P_A$ on the side surface A different from that of the electrode $Q_C$ on the side surface C, the area of the electrode $P_A$ on the side surface A being equal to that of the electrode $P_B$ on the side surface B, the area of the electrode $Q_C$ on the side surface C being equal to that of the electrode $Q_D$ on the side surface D. The voltage $V_{OUT}$ is equal to the sum of N voltages $V_i$ (i=1, 2, . . . , N) corresponding to the parts $R_i$, respectively. Thus, at least a pair, composed of two of all the terminals $T_0$, $T_i$ and $T_N$, delivers an electric signal with a voltage between two terminals which make the pair.

According to another aspect of the present invention there is provided a piezoelectric signal converter comprising the piezoelectric ceramic, electrodes M and F, formed on the side surface A, the electrodes $P_B$, $Q_C$ and $Q_D$, the terminals $T_0$ and $T_N$, the load resistance R, and the N−1 terminals $T_i$. The electrodes M and F are electrically separated each other under a condition that an area of the electrode M on the side surface A is larger than that of the electrode F on the side surface A. The piezoelectric ceramic, the electrodes M, F, $P_B$, $Q_C$ and $Q_D$, form a piezoelectric vibrator.

If an electric signal $E_{IN}$ with a voltage $V_{IN}$ is applied between the electrodes M and $P_B$, the piezoelectric vibrator is vibrated acoustically. An acoustic vibration, having a directionality mainly along the vertical direction to the side surface A, in the piezoelectric vibrator is transduced to an electric signal $E_{FB}$ between the electrodes F and $P_B$, the electric signal $E_{FB}$ being delivered between the electrodes F and $P_B$, and then applied between electrodes M and $P_B$ again. On the other hand, an acoustic vibration, having a directionality mainly along the vertical direction to the side surface C, in the piezoelectric vibrator is transduced to an electric signal $E_{OUT}$ with a voltage $V_{OUT}$ between the electrodes $Q_C$ and $Q_D$. The voltage $V_{OUT}$ is equal to the sum of N voltages $V_i$ (i=1, 2, . . . , N) corresponding to the parts $R_i$, respectively. Thus, at least a pair, composed of two of all the terminals $T_0$, $T_i$ and $T_N$, delivers an electric signal with a voltage between two terminals which make the pair.

According to other aspect of the present invention there is provided a piezoelectric signal converter comprising the piezoelectric ceramic, an input unit and at least an output unit. The input unit consists of electrodes $P_1$ and $P_2$, formed on the side surface A under an electrically separated condition each other. The output unit consists of electrodes $Q_1$ and $Q_2$, the terminals $T_0$ and $T_N$, formed on the electrodes $Q_1$ and $Q_2$, respectively, the load resistance R connected between the terminals $T_0$ and $T_N$, and the N−1 terminals $T_i$. The electrodes $Q_1$ and $Q_2$ are formed on one of the side surfaces B, C and D, under an electrically separated condition each other. An area of the electrode $P_1$ and that of the electrode $P_2$ on the side surface A are approximately the same each other, and an area of the electrode $Q_1$ and that of the electrode $Q_2$ on the one of the side surfaces B, C and D are approximately the same each other. The piezoelectric ceramic, the electrodes $P_1$, $P_2$, $Q_1$ and $Q_2$, form a piezoelectric vibrator. When the division line between the electrodes $P_1$ and $P_2$ on the side surface A is parallel to the polarization axis of the piezoelectric ceramic, the division line between the electrodes $Q_1$ and $Q_2$ on one of the side surfaces B, C and D is also parallel to the polarization axis of the piezoelectric ceramic, the polarization axis running vertical to the end surfaces thereof. On the other hand, when the division line between the electrodes $P_1$ and $P_2$ on the side surface A is vertical to the polarization axis of the piezoelectric ceramic, the division line between the electrodes $Q_1$ and $Q_2$ on one of the side surfaces B, C and D is also vertical to the polarization axis of the piezoelectric ceramic.

If an electric signal $E_{IN}$ with a voltage $V_{IN}$ is applied between the electrodes $P_1$ and $P_2$, the piezoelectric vibrator is vibrated acoustically. An acoustic vibration, in the piezoelectric vibrator is transduced to an electric signal $E_{OUT}$ with a voltage $V_{OUT}$ between the electrodes $Q_1$ and $Q_2$. The voltage $V_{OUT}$ is equal to the sum of N voltages $V_i$ (i=1, 2, ..., N) corresponding to the parts $R_i$, respectively. Thus, at least a pair, composed of two of all the terminals $T_0$, $T_i$ and $T_N$, delivers an electric signal with a voltage between two terminals which make the pair.

According to a further aspect of the present invention there is provided a piezoelectric ceramic having a pillar shape with two square end surfaces, and in addition, the polarization axis of the piezoelectric ceramic running perpendicular to the square end surfaces thereof, that is, parallel to the height direction. Such a construction of the piezoelectric ceramic makes the piezoelectric vibrator vibrated effectively, and therefore, increases a conversion efficiency from the electric signal $E_{IN}$ to the electric signal $E_{OUT}$.

BRIEF DESCRIPTION OF THE DRAWINGS

Other features and advantages of the invention will be clarified from the following description with reference to the attached drawings.

DETAILED DESCRIPTION OF THE PRESENTLY PREFERRED EXEMPLARY EMBODIMENTS

Figure 1:
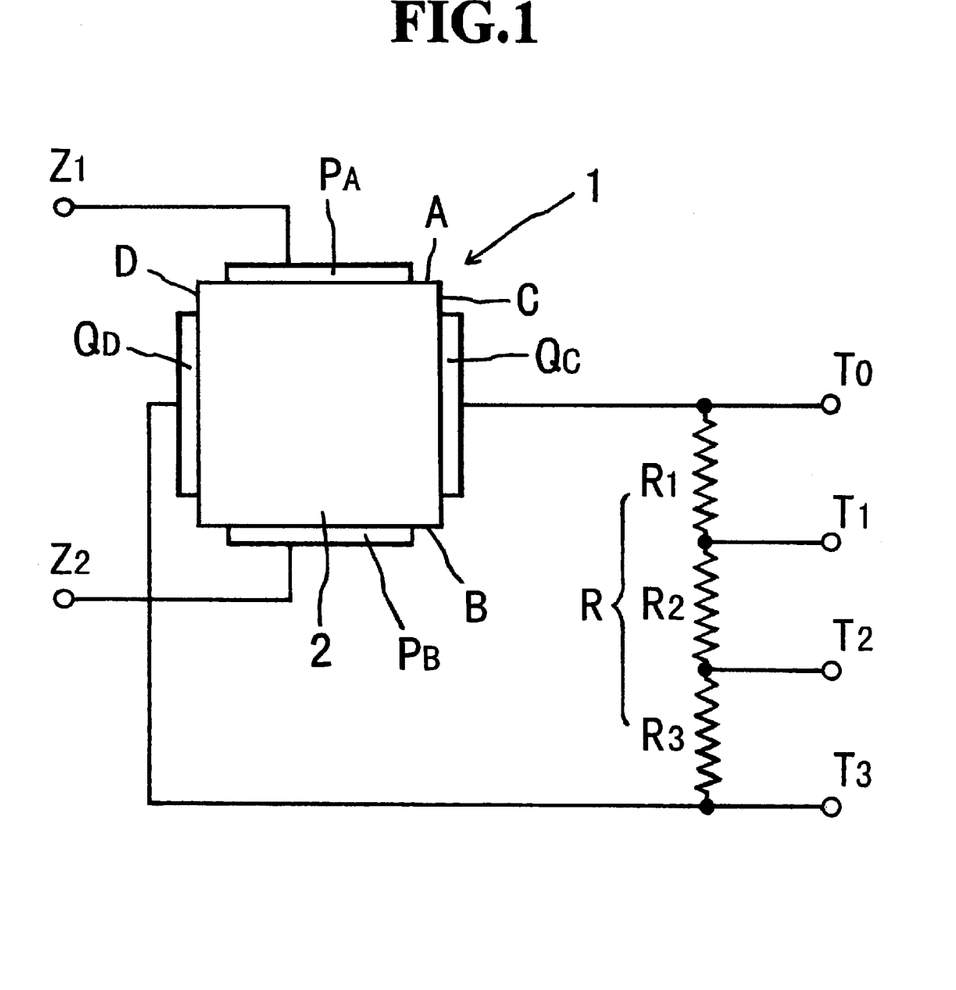
FIG. 1 shows a schematic illustration of a piezoelectric signal converter according to a first embodiment of the present invention.

FIG. 1 shows a schematic illustration of a piezoelectric signal converter according to a first embodiment of the present invention. The piezoelectric signal converter comprises piezoelectric ceramic 2 having a pillar shape with two square end surfaces and four side surfaces A, B, C and D, four electrodes $P_A$, $P_B$, $Q_C$ and $Q_D$ formed on side surfaces A, B, C, and D, respectively, two terminals $Z_1$ and $Z_2$, formed on electrodes $P_A$ and $P_B$, respectively, two terminals $T_0$ and $T_3$, formed on electrodes $Q_C$ and $Q_D$, respectively, load resistance R connected between terminals $T_0$ and $T_3$, and two terminals $T_1$ and $T_2$. The two square end surfaces of piezoelectric ceramic 2 are parallel to each other, side surfaces A and B being parallel to each other, side surfaces C and D being parallel to each other. Load resistance R consists of three parts $R_1$, $R_2$ and $R_3$, terminal $T_1$ being formed between parts $R_1$ and $R_2$, terminal $T_2$ being formed between parts $R_2$ and $R_3$. Piezoelectric ceramic 2, electrodes $P_A$, $P_B$, $Q_C$ and $Q_D$ form piezoelectric vibrator 1. In FIG. 1, piezoelectric vibrator 1 is drawn as a top-plan view, and the thickness of each of electrodes $P_A$, $P_B$, $Q_C$ and $Q_D$ is exaggerated.

Figure 2:
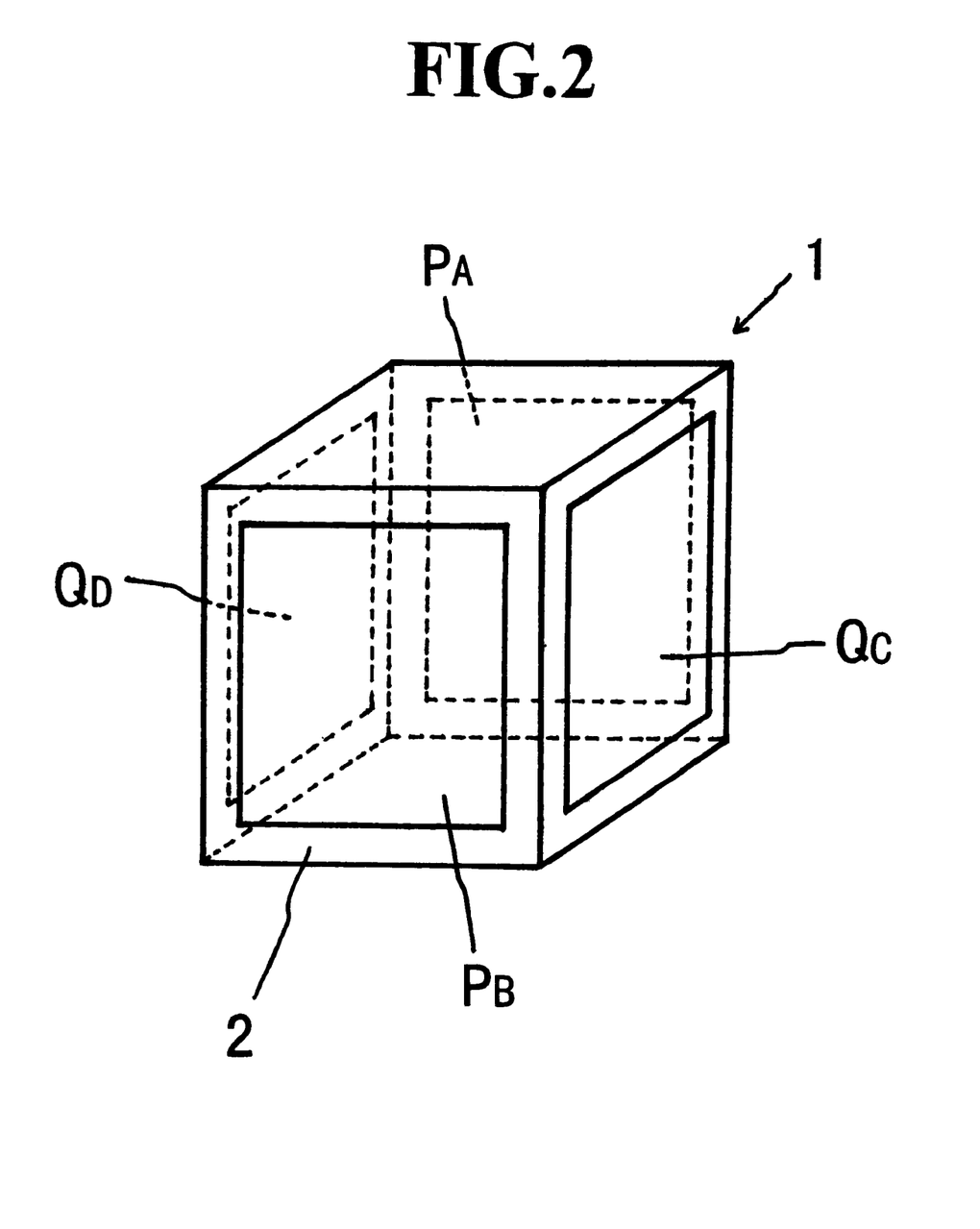
FIG. 2 shows a perspective view of piezoelectric vibrator 1.

FIG. 2 shows a perspective view of piezoelectric vibrator 1. Piezoelectric ceramic 2 with dimensions of 5 mm in length, 5 mm in width and 6 mm in height has a resonance frequency of approximately 277 kHz. The polarization axis of piezoelectric ceramic 2 runs perpendicular to the square end surfaces thereof, that is, parallel to the height direction thereof As piezoelectric vibrator 1 has such a simple structure and a small size which is very light in weight, the piezoelectric signal converter is applicable widely, for example as a switching power supply and so on.

In the piezoelectric signal converter in FIG. 1, if a high-frequency electric signal $E_{IN}$ with a voltage $V_{IN}$ is applied between terminals $Z_1$ and $Z_2$, piezoelectric vibrator 1 is vibrated acoustically, the electric signal $E_{IN}$ having approximately the same frequency as the resonance frequency of piezoelectric ceramic 2, An acoustic vibration, having a directionality mainly along the vertical direction to side surface C, in piezoelectric vibrator 1 is transduced to an electric signal $E_{OUT}$, with a voltage $V_{OUT}$ and a frequency approximately equal to the resonance frequency of piezoelectric ceramic 2, between terminals $T_0$ and $T_3$. In this time, it is possible to control the voltage $V_{OUT}$ to the voltage $V_{IN}$ by means of making an area of electrode $P_A$ on side surface A different from that of electrode $Q_C$ on side surface C, the area of electrode $P_A$ on side surface A being equal to that of electrode $P_B$ on side surface B, the area of electrode $Q_C$ on side surface C being equal to that of electrode $Q_D$ on side surface D. The voltage $V_{OUT}$ is equal to the sum of three voltages $V_1$, $V_2$ and $V_3$, corresponding to parts $R_1$, $R_2$ and $R_3$, respectively, that is, $V_{OUT}=V_1+V_2+V_3$. Therefore, it is possible that at least a pair, composed of two of all the terminals $T_0$, $T_1$, $T_2$ and $T_3$, delivers an electric signal with a voltage between two terminals which make the pair. For example, an electric signal with the voltage $V_2+V_3$ is delivered via a pair of terminals $T_1$ and $T_3$, an electric signal with the voltage $V_3$ is delivered via a pair of terminals $T_2$ and $T_3$, or the signal $E_{OUT}$ with the voltage $V_{OUT}$ is delivered via terminals $T_0$ and $T_3$. As a result, it is possible to deliver over two kinds of electric signals via over two pairs of terminals. In other words, at least a pair, composed of two of all the terminals $T_0$, $T_1$, $T_2$ and $T_3$, delivers an electric signal with a voltage between two terminals which make the pair.

As mentioned above, piezoelectric ceramic 2 in FIG. 1 has a pillar shape with two square end surfaces, and in addition, the polarization axis of piezoelectric ceramic 2 runs perpendicular to the square end surfaces thereof, that is, parallel to the height direction. Such a construction of piezoelectric ceramic 2 makes piezoelectric vibrator 1 vibrated effectively, and therefore, increases a conversion efficiency from the electric signal $E_{IN}$ to the electric signal $E_{OUT}$. Generally, a pillar shape with two rectangular end surfaces can be employed as piezoelectric ceramic 2, a cubic shape for piezoelectric ceramic 2 falling under a special case.

Figure 3:
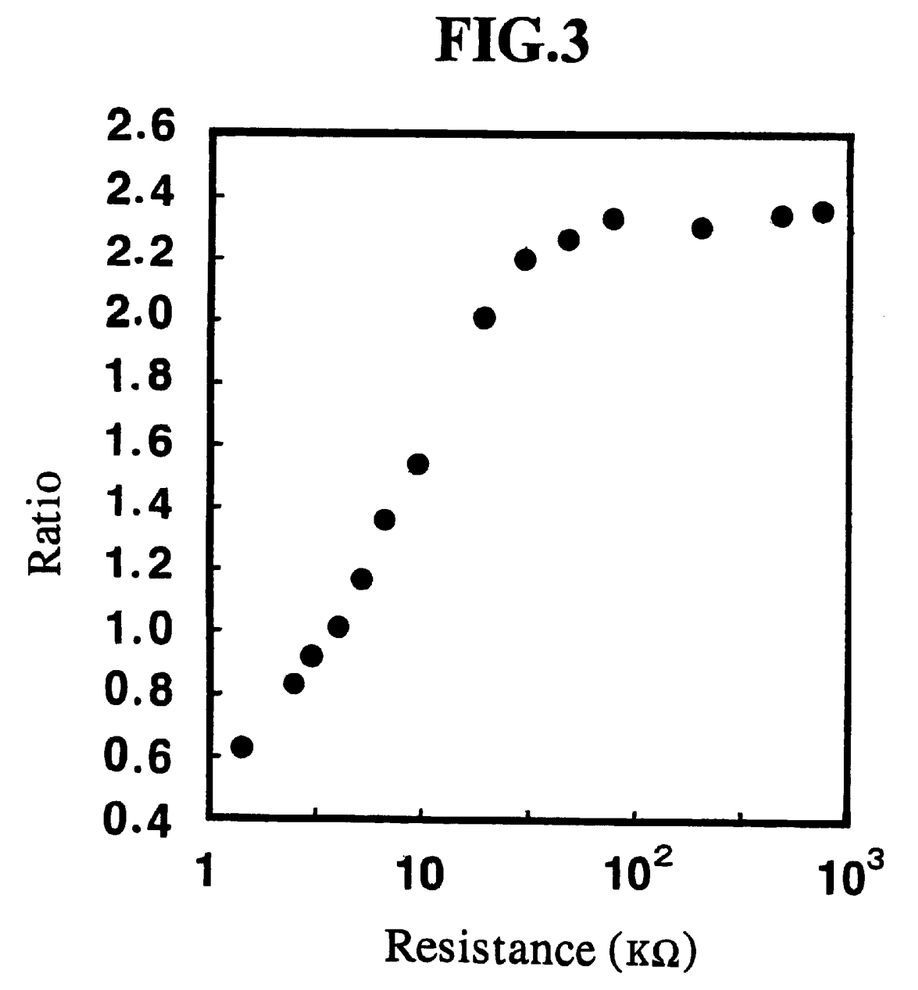
FIG. 3 shows a relationship between a magnitude of load resistance R and a voltage conversion ratio ($V_{OUT}/V_{IN}$).

FIG. 3 shows a relationship between a magnitude of load resistance R and a voltage conversion ratio ($V_{OUT}/V_{IN}$), when $V_{IN}$ is 12 V. It is clear that the voltage conversion ratio varies according to the magnitude of load resistance R, that is, the voltage $V_{OUT}$ increases or decreases according to the magnitude of load resistance R.

Figure 4:
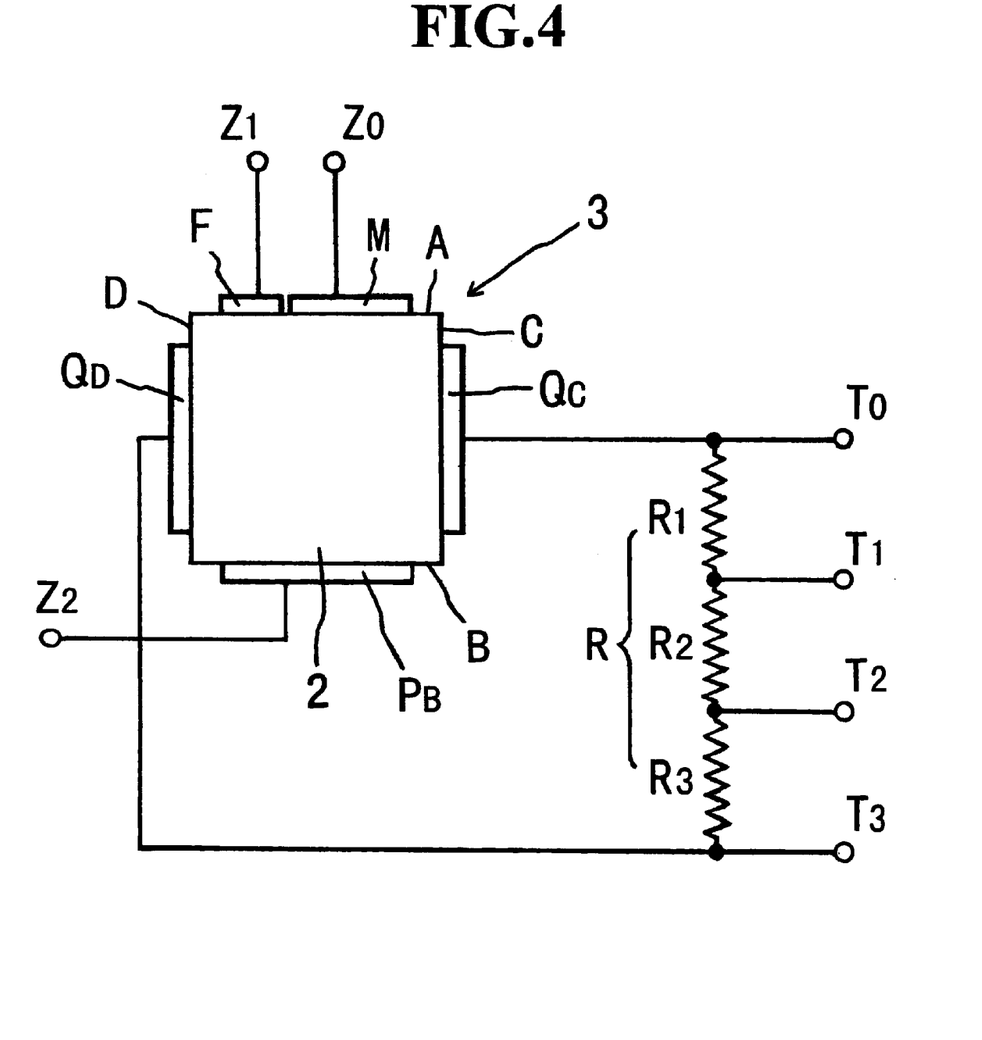
FIG. 4 shows a schematic illustration of a piezoelectric signal converter according to a second embodiment of the present invention.

FIG. 4 shows a schematic illustration of a piezoelectric signal converter according to a second embodiment of the present invention. The piezoelectric signal converter comprises piezoelectric ceramic 2, two electrodes M and F, formed on side surface A, three electrodes $P_B$, $Q_C$ and $Q_D$ formed on side surfaces B, C, and D, respectively, two terminals $Z_0$ and $Z_1$, formed on electrodes M and F, respectively, terminal $Z_2$ formed on electrode $P_B$, two terminals $T_0$ and $T_3$, formed on electrodes $Q_C$ and $Q_D$, respectively, load resistance R connected between terminals $T_0$ and $T_3$, and two terminals $T_1$ and $T_2$. Piezoelectric ceramic 2, electrodes M, F, $P_B$, $Q_C$ and $Q_D$ form piezoelectric vibrator 3. In FIG. 4, piezoelectric vibrator 3 is drawn as a top-plan view, and the thickness of each of electrodes M, F, $P_B$, $Q_C$ and $Q_D$ is exaggerated.

Figure 5:
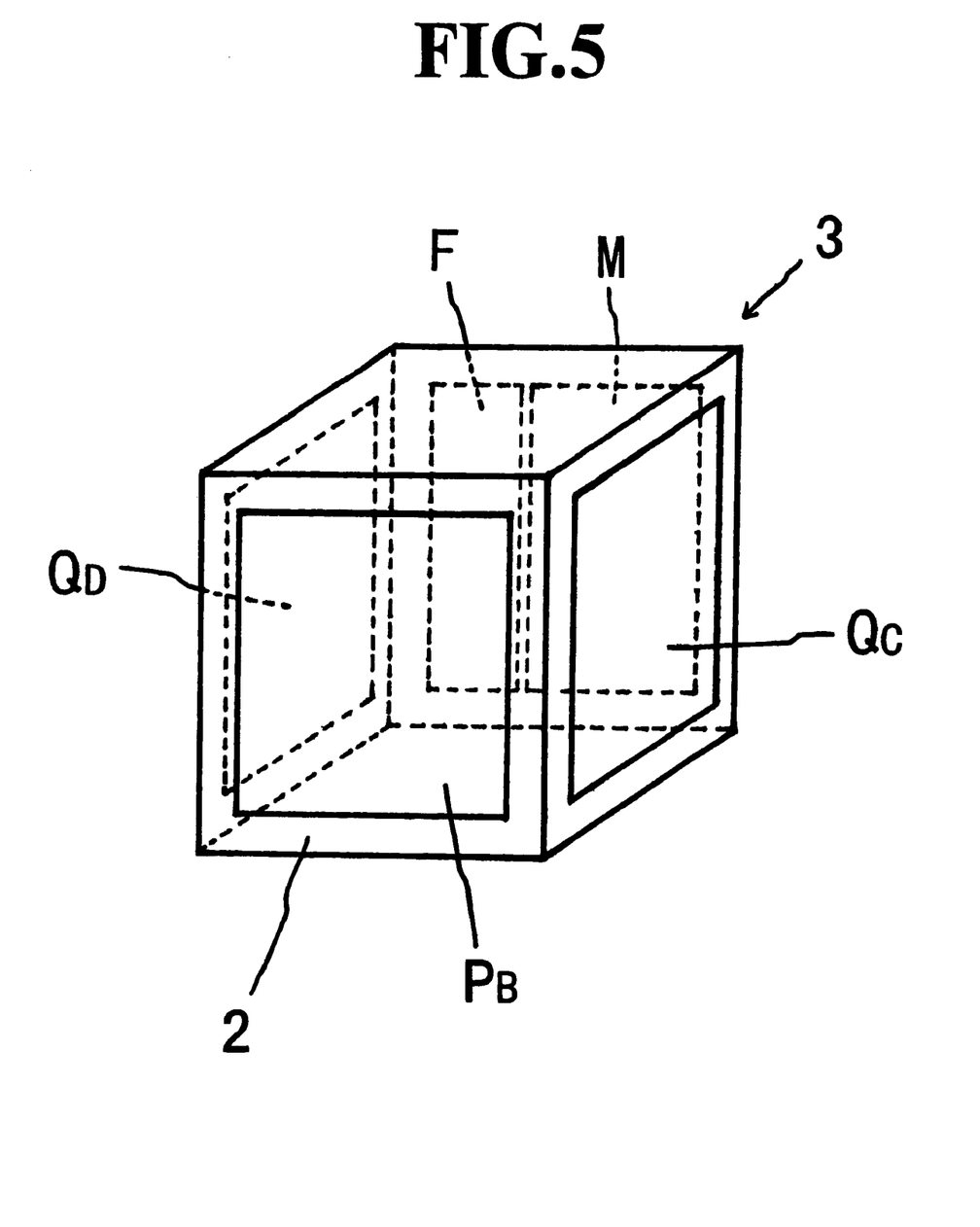
FIG. 5 shows a perspective view of piezoelectric vibrator 3.

FIG. 5 shows a perspective view of piezoelectric vibrator 3. Piezoelectric vibrator 3 has the same construction as piezoelectric vibrator 1 except for electrodes M and F on side surface A. Electrodes M and F are electrically separated each other under a condition that an area of electrode M on side surface A is larger than that of electrode F on side surface A.

Figure 6:
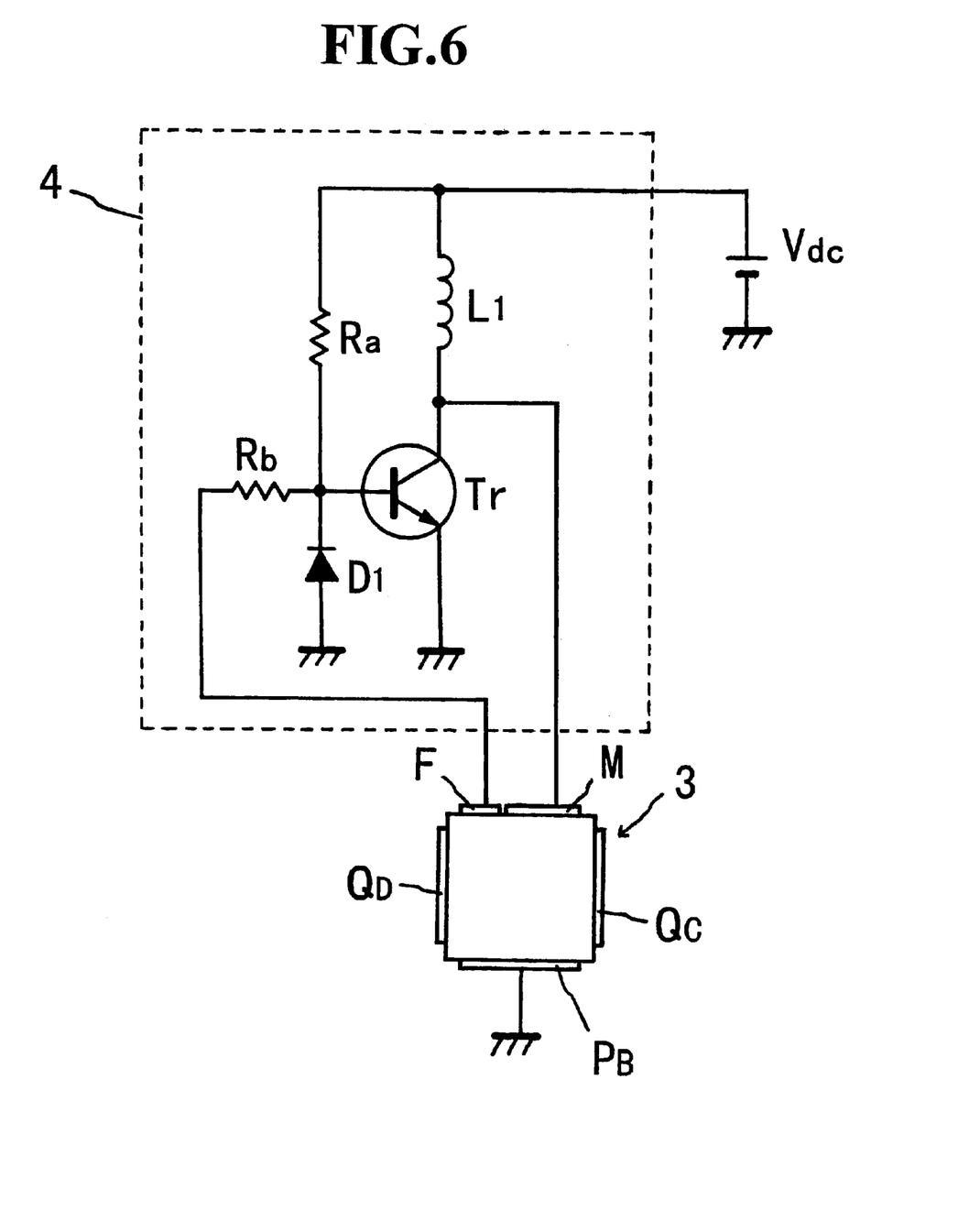
FIG. 6 shows a diagram of self-oscillation circuit 4 for vibrating piezoelectric vibrator 3.

FIG. 6 shows a diagram of self-oscillation circuit 4 for vibrating piezoelectric vibrator 3. Self-oscillation circuit 4 contains coil $L_1$, transistor $T_r$, resistances $R_a$ and $R_b$, and diode $D_1$. When an electric signal $E_{IN}$ with a voltage $V_{IN}$ is applied between electrodes M and $P_B$ from direct-current power supply $V_{dc}$ via self-oscillation circuit 4, piezoelectric vibrator 3 is vibrated acoustically. An acoustic vibration, having a directionality mainly along the vertical direction to side surface A, in piezoelectric vibrator 3 is transduced to an electric signal $E_{FB}$ between electrodes F and $P_B$, the electric signal $E_{FB}$ being delivered between electrodes F and $P_B$, then applied between electrodes M and $P_B$ again. In other words, the voltage between electrodes F and $P_B$, that arises from the piezoelectricity of piezoelectric vibrator 3 as a resonance element, is fedback via transistor $T_r$ operating as a feedback amplifier element. The voltage across coil $L_1$ is applied between electrodes M and $P_B$. The electric signal at electrode M and that at electrode F are 180° out of phase. In this way, a positive feedback loop with the optimum self oscillation is constructed. In addition, the optimum self oscillation is realized in case that electrode M has about three to four times as large area on side surface A as electrode F. Self-oscillation circuit 4 has been confirmed to work for continuous and stable acoustic vibration of piezoelectric vibrator 3 without special compensation, for considerably large resonance frequency deviation of piezoelectric vibrator 3 in the temperature range below 80° C. If the power supply voltage is 10 V, 60 $V_{p-p}$, which is the maximum, is obtained as the driving voltage of piezoelectric vibrator 3 by controlling the magnitude of coil $L_1$. At this time, an alternating current voltage of approximately 1 $V_{p-p}$ is taken out at electrode terminals F and $P_B$. Thus, piezoelectric vibrator 3 can be driven with a voltage approximately six times larger than the power supply voltage. Moreover, it is possible to construct self-oscillation circuit 4 with few parts such as coil $L_1$, transistor $T_r$, resistances $R_a$ and $R_b$, and diode $D_1$, and use direct-current power supply $V_{dc}$, causing a high power consumption efficiency, though such few parts.

In the piezoelectric signal converter shown in FIG. 4, as mentioned above, piezoelectric vibrator 3 is vibrated acoustically, when an electric signal $E_{IN}$ with a voltage $V_{IN}$ is applied between electrodes M and $P_B$ from direct-current power supply $V_{dc}$ via self-oscillation circuit 4. An acoustic vibration, having a directionality mainly along the vertical direction to side surface A, in piezoelectric vibrator 3 is transduced to an electric signal $E_{FB}$ between electrodes F and $P_B$. On the other hand, an acoustic vibration, having a directionality mainly along the vertical direction to side surface C, in piezoelectric vibrator 3 is transduced to an electric signal $E_{OUT}$ with a voltage $V_{OUT}$ between electrodes $Q_C$ and $Q_D$. The voltage $V_{OUT}$ is equal to the sum of three voltages $V_1$, $V_2$ and $V_3$, that is, $V_{OUT}=V_1+V_2+V_3$. Thus, an electric signal with the voltage $V_2+V_3$ is delivered via a pair of terminals $T_1$ and $T_3$, an electric signal with the voltage $V_3$ is delivered via a pair of terminals $T_2$ and $T_3$, or the signal $E_{OUT}$ with the voltage $V_{OUT}$ is delivered via terminals $T_0$ and $T_3$.

Figure 7:
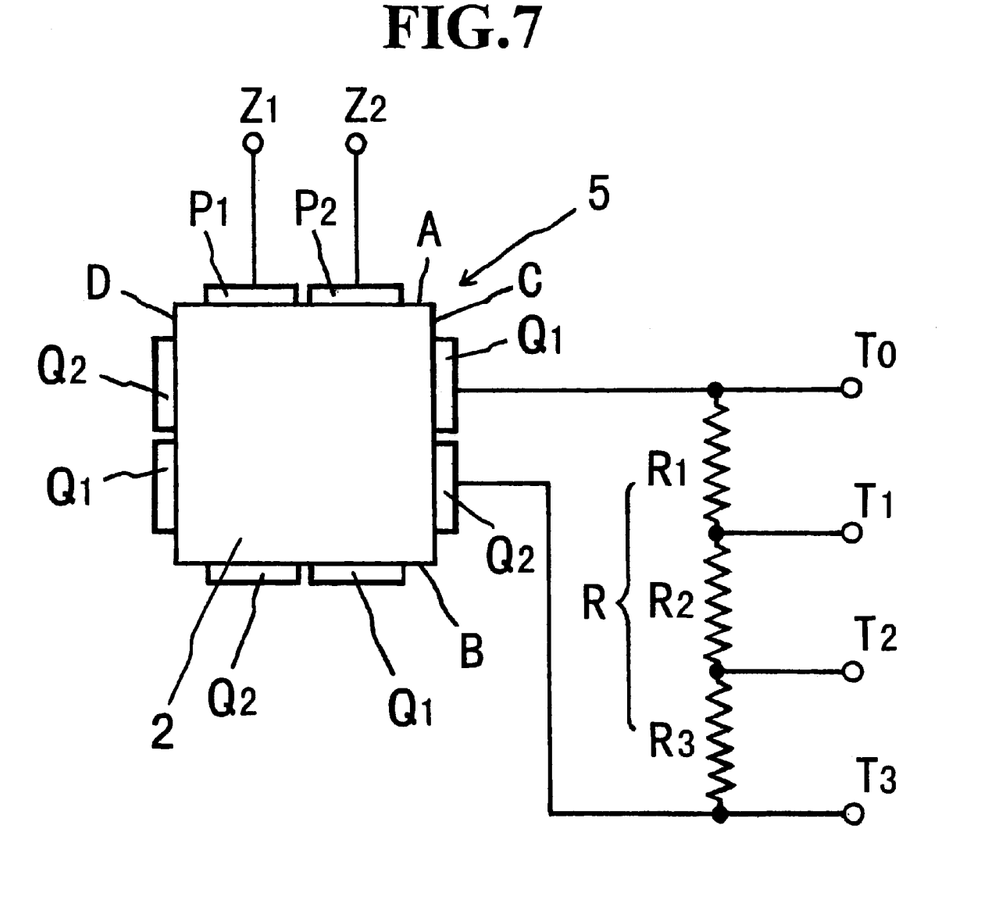
FIG. 7 shows a schematic illustration of a piezoelectric signal converter according to a third embodiment of the present invention.

FIG. 7 shows a schematic illustration of a piezoelectric signal converter according to a third embodiment of the present invention. The piezoelectric signal converter comprises piezoelectric ceramic 2, an input unit, and a first-, a second- and a third output units. The input unit consists of two electrodes $P_1$ and $P_2$, formed on side surface A, and two terminals $Z_1$ and $Z_2$, formed on electrodes $P_1$ and $P_2$, respectively. Each of the output units consists of two electrodes $Q_1$ and $Q_2$, two terminals $T_0$ and $T_3$, formed on electrodes $Q_1$ and $Q_2$, respectively, load resistance R connected between terminals $T_0$ and $T_3$, and two terminals $T_1$ and $T_2$. Electrodes $Q_1$ and $Q_2$ of the first output unit are formed on side surface B, those of the second output unit are formed on side surface C, and those of the third output unit are formed on side surface D. Piezoelectric ceramic 2 and all the electrodes $P_1$, $P_2$, $Q_1$ and $Q_2$ form piezoelectric vibrator 5. In FIG. 7, piezoelectric vibrator 5 is drawn as a top-plan view, and the thickness of each of electrodes $P_1$, $P_2$, $Q_1$ and $Q_2$ is exaggerated, in addition, terminals $T_0$, $T_1$, $T_2$, $T_3$ and load resistance R, regarding the first- and the third output units, are not drawn.

Figure 8:
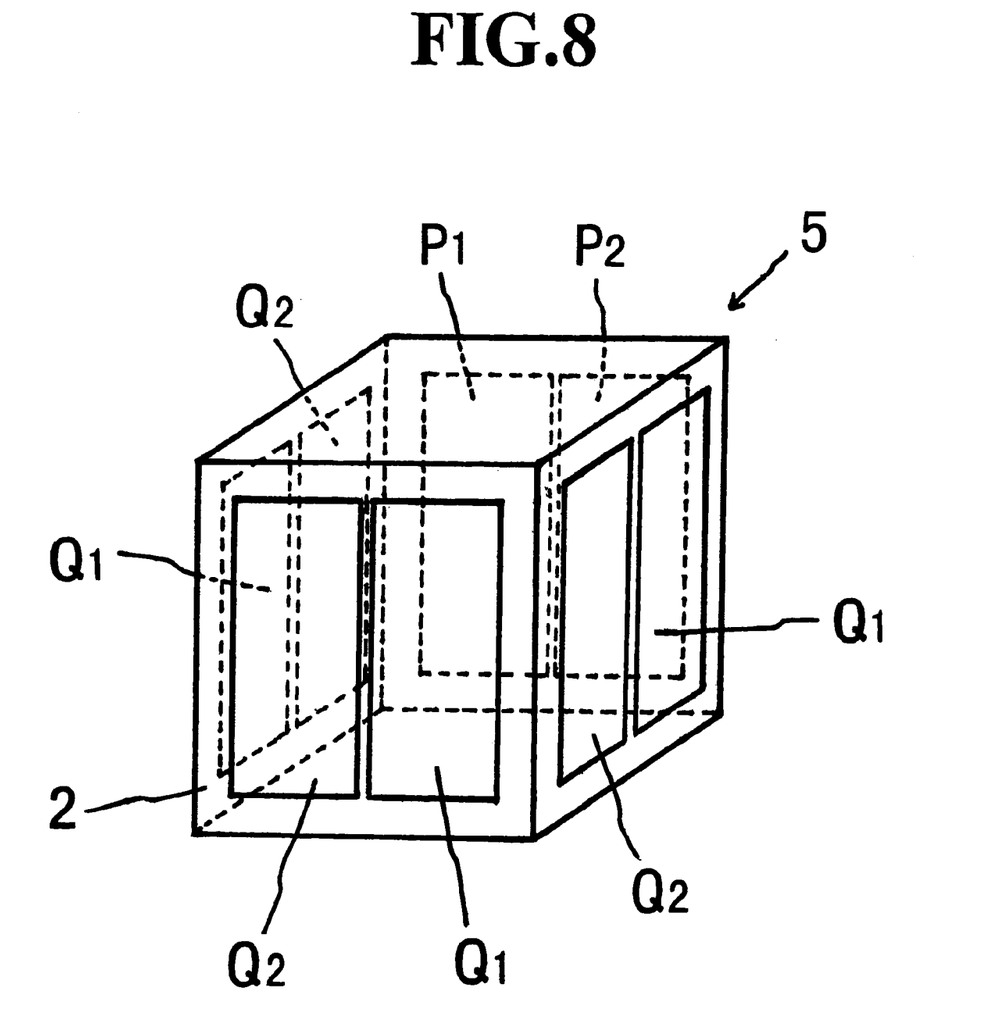
FIG. 8 shows a perspective view of piezoelectric vibrator 5.

FIG. 8 shows a perspective view of piezoelectric vibrator 5. Electrodes $P_1$ and $P_2$ are electrically separated each other under a condition that an area of electrode $P_1$ and that of electrode $P_2$ on side surface A are approximately the same each other, a division line between electrodes $P_1$ and $P_2$ being parallel to the polarization axis of piezoelectric ceramic 2. In the same way, electrodes $Q_1$ and $Q_2$ are electrically separated each other under a condition that an area of electrode $Q_1$ and that of electrode $Q_2$ on each of side surfaces B, C and D, are approximately the same each other, a division line between electrodes $Q_1$ and $Q_2$ being parallel to the polarization axis of piezoelectric ceramic 2.

In the piezoelectric signal converter in FIG. 7, if an electric signal $E_{IN}$ with a voltage $V_{IN}$ is applied between electrodes $P_1$ and $P_2$ from direct-current power supply $V_{dc}$, piezoelectric vibrator 5 is vibrated acoustically. In this time, if the power supply voltage is 12 V, the driving voltage of piezoelectric vibrator 5 is 50 $V_{p-p}$. Therefore, piezoelectric vibrator 5 can be driven with a peak voltage four times larger than the power supply voltage. An acoustic vibration, having a directionality mainly along the vertical direction to side surface A, in piezoelectric vibrator 5 is transduced to an electric signal $E_{OUT}$ with a voltage $V_{OUT}$ between electrodes $Q_1$ and $Q_2$ of the second output unit. An acoustic vibration, having a directionality mainly along the vertical direction to side surface C, in piezoelectric vibrator 5 is transduced to an electric signal $E_{OUT}$ with a voltage $V_{OUT}$ between electrodes $Q_1$ and $Q_2$ of each of the first- and the third output units. As $V_{OUT}=V_1+V_2+V_3$, an electric signal with the voltage $V_2+V_3$ is delivered via a pair of terminals $T_1$ and $T_3$, an electric signal with the voltage $V_3$ is delivered via a pair of terminals $T_2$ and $T_3$, or the signal $E_{OUT}$ with the voltage $V_{OUT}$ is delivered via terminals $T_0$ and $T_3$.

As mentioned above, the area of electrode $P_1$ and that of electrode $P_2$ on side surface A are approximately the same each other, and the area of electrode $Q_1$ and that of electrode $Q_2$ on each of side surfaces B, C and D, are approximately the same each other. Such an arrangement makes piezoelectric vibrator 5 vibrated effectively, causing an increase in conversion efficiency from the electric signal $E_{IN}$ to the electric signal $E_{OUT}$.

In the piezoelectric signal converter in FIG. 7, all the three output units are not always used at the same time. In other words, it is possible to use only one or two of the three output units according to various purposes.

Figure 9:
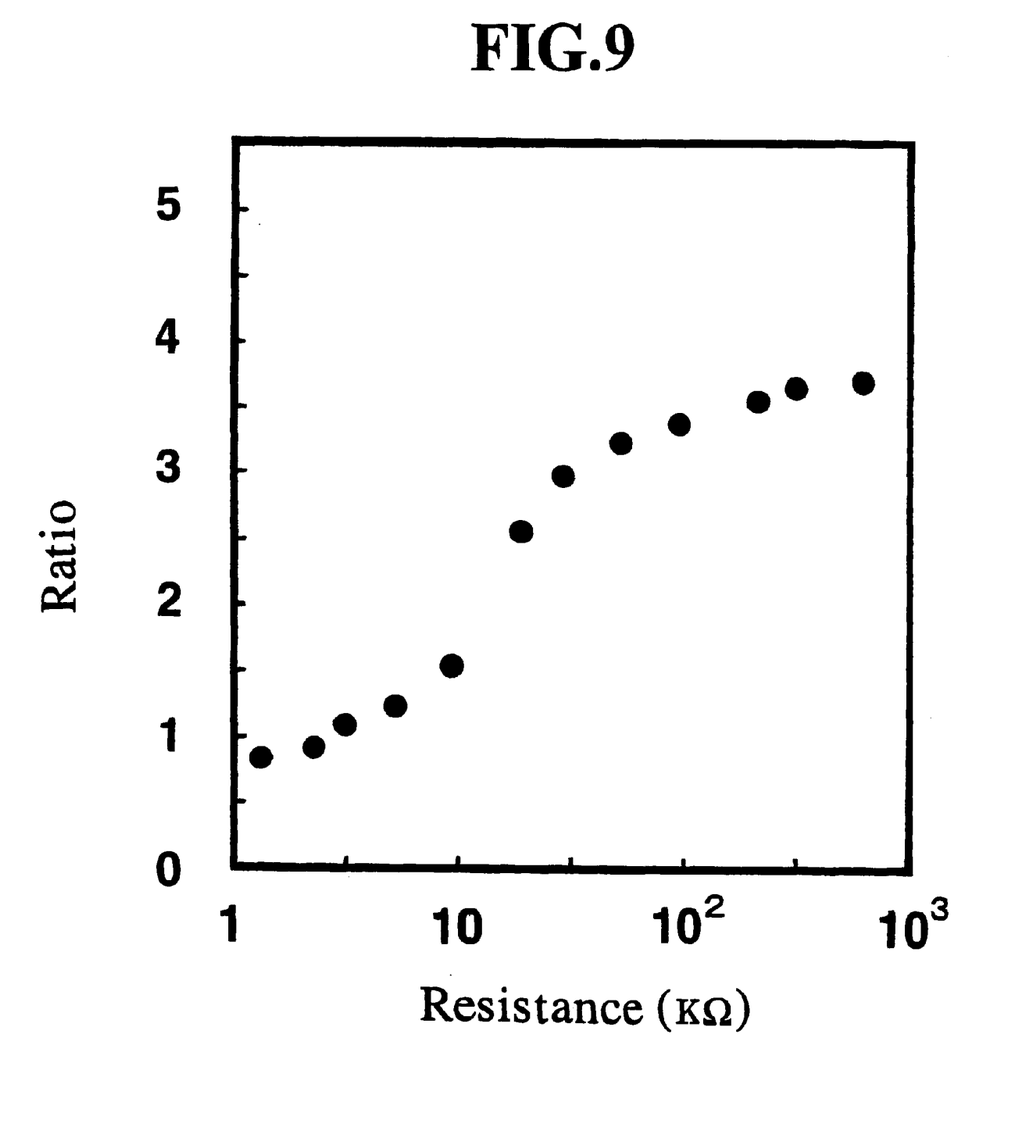
FIG. 9 shows a relationship between a magnitude of load resistance R and a voltage conversion ratio ($V_{OUT}/V_{IN}$).

FIG. 9 shows a relationship between a magnitude of load resistance R and a voltage conversion ratio ($V_{OUT}/V_{IN}$), when $V_{IN}$ is 12 V. It is clear that the voltage conversion ratio varies according to the magnitude of load resistance R, that is, the voltage $V_{OUT}$ increases or decreases according to the magnitude of load resistance R.

Figure 10:
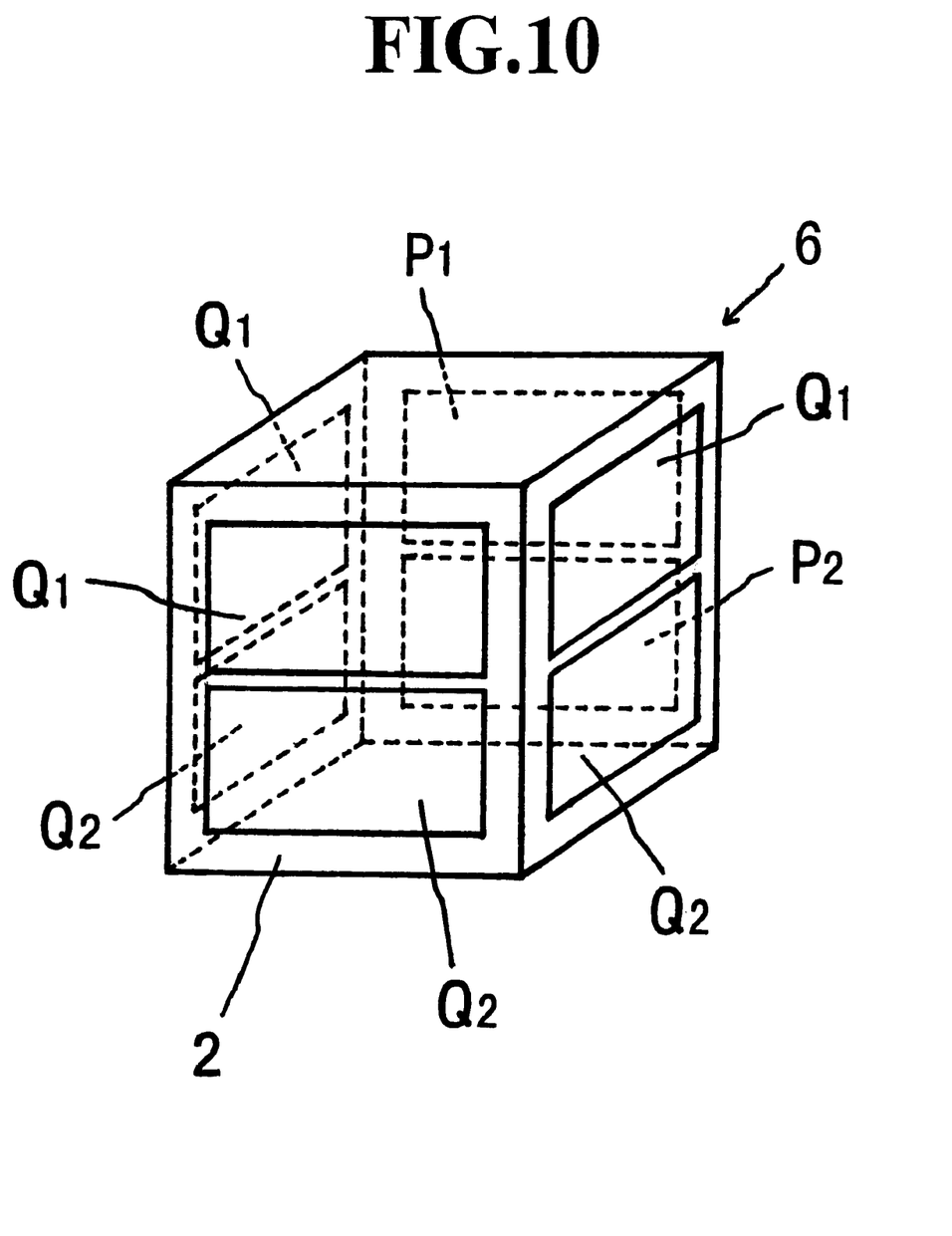
FIG. 10 shows a perspective view of piezoelectric vibrator 6, which is available in place of piezoelectric vibrator 5 in FIG. 8.

FIG. 10 shows a perspective view of piezoelectric vibrator 6, which is available in place of piezoelectric vibrator 5 in FIG. 8. Piezoelectric vibrator 6 has the same construction and the same function as piezoelectric vibrator 5 except for direction of the division line between electrodes $P_1$ and $P_2$, and that between electrodes $Q_1$ and $Q_2$. All the division lines with respect to piezoelectric vibrator 6 are vertical to the polarization axis of piezoelectric ceramic 2.

While this invention has been described in connection with what is presently considered to be the most practical and preferred embodiment, it is to be understood that the invention is not limited to the disclosed embodiment, but, on the contrary, is intended to cover various modifications and equivalent arrangements included within the spirit and scope of the appended claims.

What is claimed is:

1. A piezoelectric signal converter comprising:
   a piezoelectric ceramic having a pillar shape with two rectangular end surfaces and four side surfaces A, B, C and D, said end surfaces being parallel to each other, said side surfaces A and B being parallel to each other, said side surfaces C and D being parallel to each other;
   two electrodes $P_A$ and $P_B$, formed on said side surfaces A and B, respectively;
   two electrodes $Q_C$ and $Q_D$, formed on said side surfaces C and D, respectively;
   two terminals $T_0$ and $T_N$, formed on said electrodes $Q_C$ and $Q_D$, respectively;
   a load resistance R connected between said terminals $T_0$ and $T_N$, said load resistance R consisting of at least three parts $R_i$ (i=1, 2, . . . , N); and
   at least two terminals $T_i$ {i=1, 2, . . . , (N−1)} the (N−1)th terminal $T_{(N-1)}$ being located between the (N−1)th part ($R_{N-1}$) and the Nth part $R_N$,
   said piezoelectric ceramic, said electrodes $P_A$, $P_B$, $Q_C$ and $Q_D$, forming a piezoelectric vibrator,
   said electrodes $P_A$ and $P_B$ receiving a high-frequency electric signal $E_{IN}$ with a voltage $V_{IN}$, and causing said piezoelectric vibrator to vibrate at a frequency approximately equal to the resonance frequency of said piezoelectric ceramic,
   said electrodes $Q_C$ and $Q_D$ transducing an acoustic vibration in said piezoelectric vibrator to an electric signal $E_{OUT}$ with a voltage $V_{OUT}$ and a frequency approximately equal to said resonance frequency, said voltage $V_{OUT}$ being equal to the sum of N voltages $V_i$ (i=1, 2, . . . , N) corresponding to said parts $R_i$, respectively,
   at least a pair, composed of two of all said terminals $T_0$, $T_i$ and $T_N$, delivering an electric signal with a voltage between two terminals which make said pair.

2. A piezoelectric signal converter as defined in claim 1, wherein said acoustic vibration transduced via said electrodes $Q_C$ and $Q_D$ has a directionality mainly along the vertical direction to said side surface C.

3. A piezoelectric signal converter as defined in claim 1, wherein an area of said electrode $P_A$ on said side surface A is equal to that of said electrode $P_B$ on said side surface B and different from that of said electrode $Q_C$ on said side surface C, an area of said electrode $Q_D$ on said side surface D being equal to that of said electrode $Q_C$ on said side surface C.

4. A piezoelectric signal converter as defined in claim 1, wherein said end surfaces of said piezoelectric ceramic have a square shape.

5. A piezoelectric signal converter as defined in claim 1, wherein the polarization axis of said piezoelectric ceramic is orthogonal to said two rectangular end surfaces of said piezoelectric ceramic.

6. A piezoelectric signal converter comprising:
   a piezoelectric ceramic having a pillar shape with two rectangular end surfaces and four side surfaces A, B, C and D, said end surfaces being parallel to each other, said side surfaces A and B being parallel to each other, said side surfaces C and D being parallel to each other;
   two electrodes M and F, formed on said side surface A under an electrically separated condition from each other;
   an electrode $P_B$ formed on said side surface B;
   two electrodes $Q_C$ and $Q_D$, formed on said side surfaces C and D, respectively;
   two terminals $T_0$ and $T_N$, formed on said electrodes $Q_C$ and $Q_D$, respectively;
   a load resistance R connected between said terminals $T_0$ and $T_N$, said load resistance R consisting of at least three parts $R_i$ (i=1, 2, . . . , N); and
   at least two terminals $T_i$ {i=1, 2, . . . , (N−1)}, the (N−1)th terminal $T_{(N-1)}$ being located between the (N−1)th part $R_{(N-1)}$ and the Nth part $R_N$, said piezoelectric ceramic, said electrodes M, F, $P_B$, $Q_C$ and $Q_D$, forming a piezoelectric vibrator, said electrodes M and $P_B$ receiving a high-frequency electric signal $E_{IN}$ with a voltage $V_{IN}$, and causing said piezoelectric vibrator to vibrate at a frequency approximately equal to the resonance frequency of said piezoelectric ceramic, said electrodes F and $P_B$ transducing an acoustic vibration in said piezoelectric vibrator to an electric signal $E_{FB}$, and supplying said electrodes M and $P_B$ with said electric signal $E_{FB}$ again, said electrodes $Q_C$ and $Q_D$ transducing another acoustic vibration in said piezoelectric vibrator to an electric signal $E_{OUT}$ with a voltage $V_{OUT}$ and a frequency approximately equal to said resonance frequency, said voltage $V_{OUT}$ being equal to the sum of N voltages $V_i$ (i=1, 2, . . . , N) corresponding to said parts $R_i$, respectively, at least a pair, composed of two of all said terminals $T_0$, $T_i$ and $T_N$, delivering an electric signal with a voltage between two terminals which make said pair.

7. A piezoelectric signal converter as defined in claim 6, wherein said acoustic vibration transduced via said electrodes F and $P_B$ has a directionality mainly along the vertical direction to said side surface A, and said another acoustic vibration transduced via said electrodes $Q_C$ and $Q_D$ has a directionality mainly along the vertical direction to said side surface C.

8. A piezoelectric signal converter as defined in claim 6, wherein an area of said electrode M on said side surface A is larger than that of said electrode F on said side surface A.

9. A piezoelectric signal converter as defined in claim 6, wherein said end surfaces of said piezoelectric ceramic have a square shape.

10. A piezoelectric signal converter as defined in claim 6, wherein the polarization axis of said piezoelectric ceramic is orthogonal to said two rectangular end surfaces of said piezoelectric ceramic.

11. A piezoelectric signal converter comprising:

a piezoelectric ceramic having a pillar shape with two rectangular end surfaces and four side surfaces A, B, C and D, said end surfaces being parallel to each other, said side surfaces A and B being parallel to each other, said side surfaces C and D being parallel to each other;

an input unit consisting of two electrodes $P_1$ and $P_2$, formed on said side surface A under an electrically separated condition each other; and at least an output unit consisting of two electrodes $Q_1$ and $Q_2$, formed on one of said side surfaces B, C and D, under an electrically separated condition each other, two terminals $T_0$ and $T_N$, formed on said electrodes $Q_1$ and $Q_2$, respectively, a load resistance R connected between said terminals $T_0$ and $T_N$, said load resistance R consisting of at least three parts $R_i$ (i=1, 2, . . . , N), and at least two terminals $T_i$ {i=1, 2, . . . , (N−1)}, the (N−1)th terminal $T_{(N-1)}$ being located between the (N−1)th part $R_{(N-1)}$ and the Nth part $R_N$, said piezoelectric ceramic, said electrodes $P_1$, $P_2$, $Q_1$ and $Q_2$, forming a piezoelectric vibrator, said electrodes $P_1$ and $P_2$ receiving a high-frequency electric signal $E_{IN}$ with a voltage $V_{IN}$, and causing said piezoelectric vibrator to vibrate at a frequency approximately equal to the resonance frequency of said piezoelectric ceramic, said electrodes $Q_1$ and $Q_2$ transducing an acoustic vibration in said piezoelectric vibrator to an electric signal $E_{OUT}$ with a voltage $V_{OUT}$ and a frequency approximately equal to said resonance frequency, said voltage $V_{OUT}$ being equal to the sum of N voltages $V_i$ (i=1, 2, . . . , N) corresponding to said parts $R_i$, respectively, at least a pair, composed of two of all said terminals $T_0$, $T_i$ and $T_N$, delivering an electric signal with a voltage between two terminals which make said pair.

12. A piezoelectric signal converter as defined in claim 11, wherein said acoustic vibration transduced via said electrodes $Q_1$ and $Q_2$ has a directionality mainly along the vertical direction to said one of said side surfaces B, C and D.

13. A piezoelectric signal converter as defined in claim 11, wherein said end surfaces of said piezoelectric ceramic have a square shape.

14. A piezoelectric signal converter as defined in claim 11, wherein the polarization axis of said piezoelectric ceramic is orthogonal to said two rectangular end surfaces of said piezoelectric ceramic.

15. A piezoelectric signal converter as defined in claim 11, wherein an area of said electrode $P_1$ and that of said electrode $P_2$ on said side surface A are approximately the same each other, and an area of said electrode $Q_1$ and that of said electrode $Q_2$ on said one of said side surfaces B, C and D are approximately the same each other.

16. A piezoelectric signal converter as defined in claim 11, wherein both the division line between said electrodes $P_1$ and $P_2$ on said side surface A, and that between said electrodes $Q_1$ and $Q_2$ on said one of said side surfaces B, C and D are parallel to the polarization axis of said piezoelectric ceramic, said polarization axis being orthogonal to said two rectangular end surfaces of said piezoelectric ceramic.

17. A piezoelectric signal converter as defined in claim 11, wherein both the division line between said electrodes $P_1$ and $P_2$ on said side surface A, and that between said electrodes $Q_1$ and $Q_2$ on said one of said side surfaces B, C and D are vertical to the polarization axis of said piezoelectric ceramic, said polarization axis being orthogonal to said two rectangular end surfaces of said piezoelectric ceramic.

* * * * *